United States Patent
Dutta et al.

(10) Patent No.: US 7,295,937 B2
(45) Date of Patent: Nov. 13, 2007

(54) METHOD AND SYSTEM FOR DETERMINING NOISE COMPONENTS OF AN ANALOG-TO-DIGITAL CONVERTER

(75) Inventors: Goutam Dutta, Bangalore (IN); Vineet Mishra, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/185,131

(22) Filed: Jul. 20, 2005

(65) Prior Publication Data

US 2007/0032971 A1   Feb. 8, 2007

(51) Int. Cl.
*G01R 29/26*   (2006.01)
(52) U.S. Cl. ........................................ 702/69
(58) Field of Classification Search .................. 702/69
See application file for complete search history.

(56) References Cited

U.S. PATENT DOCUMENTS

| 6,232,905 | B1 | 5/2001 | Smith et al. |
| 6,384,757 | B1 | 5/2002 | Kosonen |
| 6,580,383 | B1 | 6/2003 | Devendorf et al. |
| 6,640,193 | B2 * | 10/2003 | Kuyel ........................ 702/69 |
| 6,701,297 | B2 | 3/2004 | Main |
| 6,775,321 | B1 * | 8/2004 | Soma et al. ................ 375/226 |
| 6,853,322 | B2 | 2/2005 | Dedic |
| 2005/0219101 | A1 * | 10/2005 | Kurose et al. ............. 341/155 |

* cited by examiner

*Primary Examiner*—Bryan Bui
*Assistant Examiner*—Jonathan Moffat
(74) *Attorney, Agent, or Firm*—Wade J. Brady, III; Frederick J. Telecky, Jr.

(57) ABSTRACT

A method and system is provided for determining noise components of an analog-to-digital converter. In one aspect of the invention, a method comprises providing an input signal to a signal input and a clock input of the ADC, outputting a plurality of samples at a sampled phase on the input signal for a plurality of sampled phases, and determining a jitter noise factor value, a reference noise factor value, and a total noise spectrum based on the plurality of samples for each of the plurality of sampled phases. A least means square algorithm is performed on the plurality of jitter noise factor values, reference noise factor values, and total noise spectra to estimate at least one of a jitter noise component and a reference noise component.

18 Claims, 3 Drawing Sheets

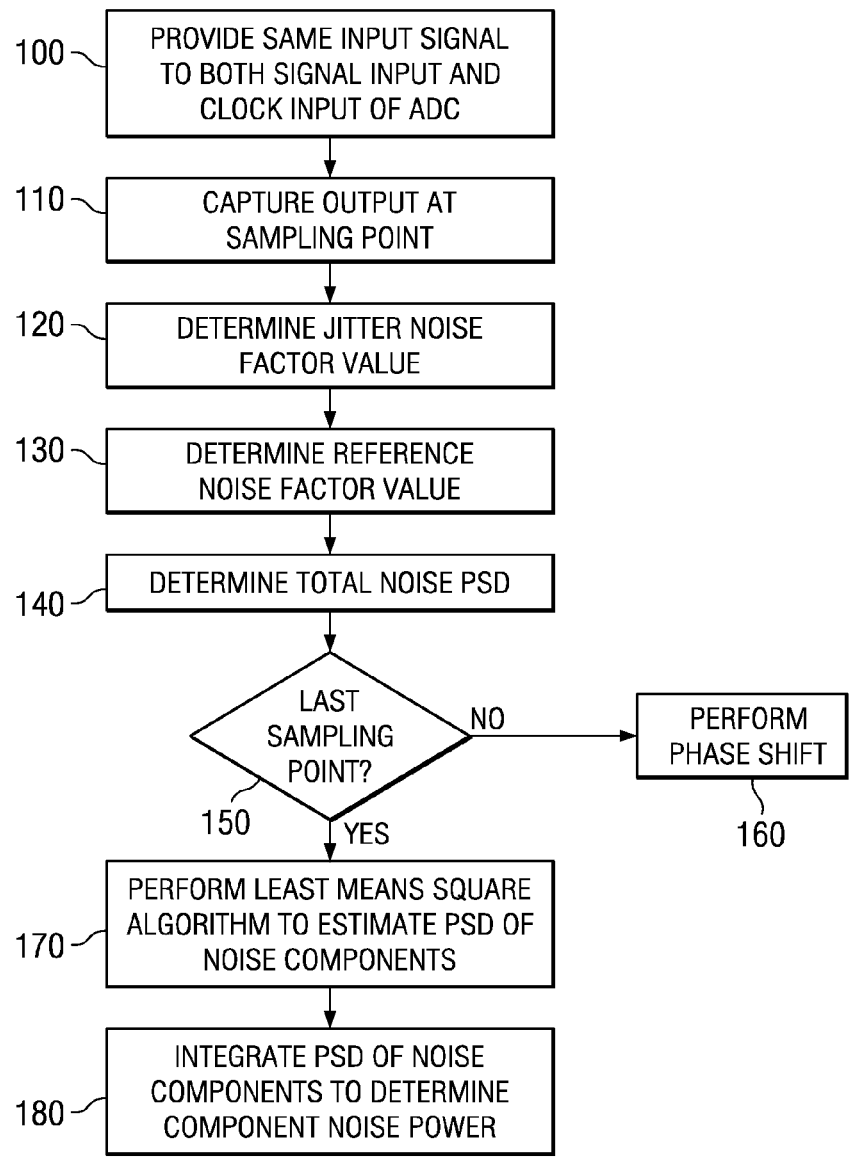

METHOD AND SYSTEM FOR DETERMINING NOISE COMPONENTS OF AN ANALOG-TO-DIGITAL CONVERTER

TECHNICAL FIELD

The present invention relates generally to electrical circuits, and more particularly to a method and system for determining noise components of an analog-to-digital converter.

BACKGROUND

Pipeline analog-to-digital converters (ADCs) offer very high resolution while converting at very high sample rates. Pipeline ADCs are widely used in base station, ultrasound and test and measurement applications. In most of these applications, it is important to quantify and characterize the noise performance of the ADC. The major noise components of a pipeline ADC are, noise contributed by aperture jitter, reference noise, thermal noise and channel flicker noise. Furthermore, the output of an ADC is also affected by phase noise of the input signal relative to the clock source.

Thermal noise and channel flicker noise are fairly constant over input conditions and relatively easy to estimate. Reference noise depends primarily on the instantaneous value of the input (e.g., number of capacitors in the First Stage getting connected to reference nodes) and can be estimated by giving DC inputs and comparing noise performance for a full scale DC and a zero DC input. Aperture jitter is the most challenging to characterize. It is difficult to isolate the relative phase noise between input and clock sources from aperture jitter. Hence more often than not, characterization of device aperture jitter is biased with source phase noise effects.

SUMMARY

In one aspect of the invention, a method is provided for determining noise components of an analog-to-digital converter (ADC). The method comprises providing the same input signal (e.g., filtered sinusoid) to a signal input and a clock input of the ADC, outputting a plurality of samples at a given sampled phase on the input signal and determining a jitter noise factor, a reference noise factor, and a total noise spectrum based on the plurality of samples for each of a plurality of sampled phases. A least means square algorithm based on the plurality of jitter noise factor values, reference noise factor values, and total noise spectra is used to estimate at least one of an aperture jitter noise component and a reference noise component.

In another aspect of the invention, a method is provided for determining noise components of a pipeline ADC. The method comprises providing a sine wave input signal having a fixed frequency and a fixed amplitude to a signal input and a clock input of the ADC, capturing a plurality of digital samples output by the ADC at a sampled phase on the input signal, and determining a jitter noise factor, a reference noise factor, and a total noise spectrum based on the plurality of digital samples at the sampled phase. The method further comprises adjusting one of a first path length to the signal input and second path length to the clock input from the sine wave input signal over a plurality of varying path lengths to phase shift the input signal relative to the clock signal to provide a plurality of sampled phases, and repeating the providing, capturing, determining and phase shifting over the plurality of sampled phases to determine a jitter noise factor, a reference noise factor, and a total noise spectrum for each of the plurality of sampled phases. A least means square algorithm based on the plurality of jitter noise factor values, reference noise factor values, and total noise spectra is used to estimate a jitter noise power spectrum density, a reference noise power spectrum density and a constant substantially equal to a power spectrum density of a sum of a channel flicker noise and a thermal noise.

In another aspect of the present invention, a system is provided for determining noise components of a pipeline ADC. The system comprises a radio frequency (RF) source operative to provide a sine wave input signal of a fixed frequency and amplitude, a plurality of cable assemblies, having an input for connecting to the RF source, a first branch connecting to a signal input of the pipeline ADC and a second branch connecting to a clock input of the ADC for providing the sine wave input signal to both the signal input and the clock input of the ADC. Each of the plurality of cable assemblies have branches with different relative lengths with respect to the first branch and second branch for phase shifting the input signal relative to the clock signal, such that a different sampling phase is sampled by the ADC for each of the plurality of cable assemblies coupled between the RF source and the ADC. An analysis system is provided that is operative to capture a plurality of output samples for each sampled phase and be employed to determine a jitter noise factor, a reference noise factor, and a total noise spectrum for each of the different sampled phases.

BRIEF DESCRIPTION OF THE DRAWINGS

FIG. 5 illustrates a methodology for determining noise components of a pipelined ADC in accordance with an aspect of the present invention.

DETAILED DESCRIPTION

A method and system are provided for determining noise components of an ADC. The method and system employ a single source as an input signal and a clock signal to an ADC. The single source signal is divided into two branches and provided to a clock input and a signal input. Since the ADC's sampling frequency is same as input frequency, the sampled output should be around a fixed value. The variations are due to the total noise in the A/D conversion process and include thermal noise, channel flicker noise, reference noise and aperture jitter noise. The source phase spectral noise has been eliminated as there is no relative phase movement between input and clock. The method and system provide a mechanism for determining values for aperture jitter noise, reference noise, and a total for thermal and flicker noise.

Figure 1:
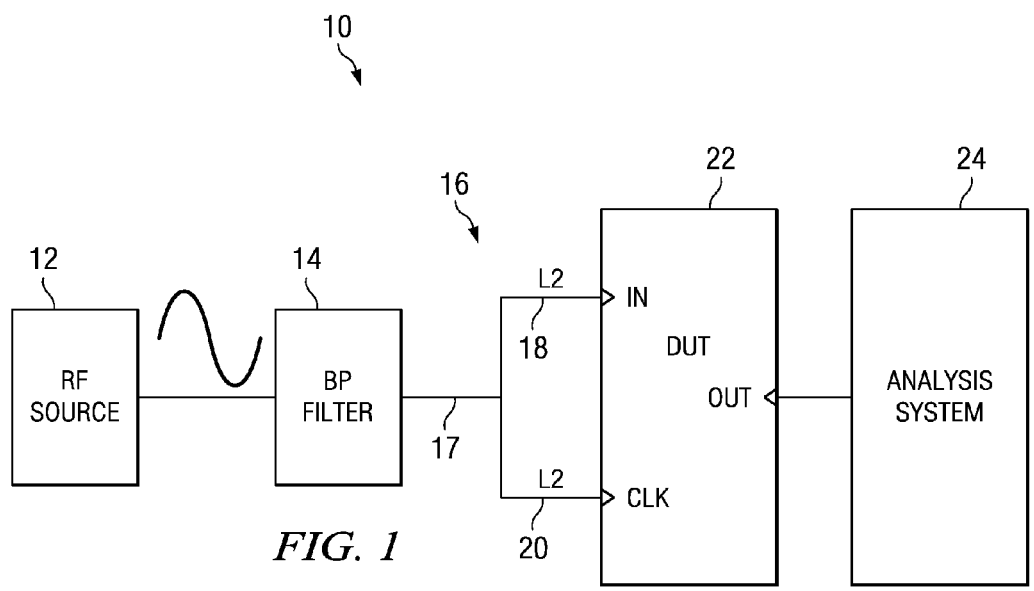
FIG. 1 illustrates a block diagram of a test system in accordance with an aspect of the present invention.

FIG. 1 illustrates a test system 10 for determining noise components of a pipeline ADC 22 in accordance with an aspect of the present invention. The test system 10 includes a single RF source 12 that generates a sinusoid signal that is provided as a signal input and also as a clock input of the pipelined ADC 22. [The typical setup for characterizing a pipeline ADC employs two high quality RF sources to provide an input signal and clock signal to the device. The sources are reference locked that prevents steady state frequency drift between the two sources. The inputs and clocks are filtered and fed to the device using suitable drivers. The input and clock sources are independently controlled while maintaining frequency coherence. Such a setup contributes to a relative spectral phase noise from the two sources.] In accordance with an aspect of the present invention, by employing a single signal source for both the signal input and clock input of a pipeline ADC, the source spectral noise associated with employing separate clock and input sources has been eliminated.

The input signal in the present example is a sine wave of a fixed amplitude and frequency. The input signal is filtered employing a band pass filter 14. The filtered input signal is provided to a signal input and a clock input of the pipeline ADC 22, which is the device under test (DUT) via a cable assembly 16. Since the input signal to the signal input and clock input are at the same frequency, the ADC 22 will sample at the same zone (e.g., phase) of the signal input with the small variations in the output set of codes (for that sampled phase) corresponding to the total noise in the A/D conversion process, which includes thermal noise, flicker noise, reference noise and aperture jitter noise. Different sampled phase points of the input signal can be sampled by phase shifting the input signal to one of the signal input or clock input relative to the other of the signal input and clock input.

The cable 16 has an input portion 17 and two output portions that include a first cable output portion 18 having a first path length L1 providing the input signal to the signal input of the DUT 22, and a second cable output portion 20 having a second path length L2 providing the input signal to the clock input of the DUT 22. The path lengths are varied, such that the first path length L1 or second path length L2 is changed relative to the other of the first path length L1 or second path length L2. This shall result in phase shifting the two signals relative to each other, such that different phases are sampled (different points on the input signal) for each variation in path length. The path lengths can be varied by manually adjusting the cable lengths relative to each other (e.g., by employing cables with different path lengths). It is to be appreciated that a variety of other techniques can be employed for phase shifting one of the signal input and clock input relative to the other, so that different phases of the signal input can be captured.

For each phase setting, the output digital codes are captured by an analysis system 24 and the spectrum is analyzed. The analysis system 24 can be comprised of a plurality of different analysis devices that can be interfaced to automatically or manually. The noise power spectral density is computed doing a FFT-based averaged power spectral analysis on the plurality of output codes. The integrated noise power is derived by summing up all the noise spectral density bins while, the mean of the digital codes across several samples provides a measure of the phase where the signal had been sampled. The method and system, phase shift the input signal or clock signal relative to the other of the input signal or clock signal and repeat the capturing of the digital codes to determine a jitter noise factor, a reference noise factor and a total noise power spectral density at several phases along the input signal. The individual noise components resulting from jitter, reference noise, thermal noise and channel flicker noise are then estimated using a least mean square (LMS) estimation.

The following description provides a proof of the methodologies in accordance with one or more aspects of the present invention. For a given sampled phase—$\phi_i$, let $\mu_i$ be the mean of the digital codes, and $S_i(f)$ be the output noise spectrum obtained from a FFT-based average power spectral density (PSD) computation on the set of captured codes. In accordance with an aspect of the present invention, the total noise contribution on the ADC output comes from the cumulative and independent effects of aperture jitter, reference noise, thermal noise and channel flicker noise. The ADC resolution is not considered a limiting factor.

Knowing the input amplitude ($A_0$) and frequency ($f_0$), it is possible to estimate the slope of the input sinusoid—$\psi_i$, as, $$\psi_i^2 = 4\pi^2 f_0^2 A_0^2 (1-(\mu_i/A_0)^2) \qquad \text{EQ. 1}$$

With an rms jitter of $J_{rms}$, the contribution of jitter noise power ($n_j^2$) is given by $$n_{J,i}^2 = J_{rms}^2 * \psi_i^2 \qquad \text{EQ. 2}$$

Alternatively, in spectral domain, $$S_{J,i}(f) = \zeta(f) * \psi_i^2 \qquad \text{EQ. 3}$$

where, $\zeta(f)$ is the power spectral distribution of aperture jitter (in $s^2$/Hz) and $S_{J,i}(f)$ is the contribution of aperture jitter in the total noise floor for sampled phase $\phi_i$.

It is also possible to identify the Stage-1 thresholds and the corresponding number of capacitors connected to the reference corresponding to the mean code ($\mu_i$). The INL plots of a pipeline ADC are direct indicators of Stage-1 thresholds for a corresponding code. If $n_i$ represent the number of capacitors in Stage-1 connected to references corresponding to average code $\mu_i$, the associated reference noise ($n_R^2$) can be estimated as:

$$n_{R,i}^2 = (n_i^2 * \sigma_R^2)/N^2 \qquad \text{EQ. 4}$$

where, $\sigma_R^2$ is the total reference noise, and N is the total number of Stage-1 capacitors that may get connected to references for a possible full-scale input.

In spectral domain, EQ. 4 may be written as:

$$S_{R,i}(f) = \rho(f) * n_i^2/N^2 \qquad \text{EQ. 5}$$

where $\rho(f)$ represents the power spectral density of reference noise, and $S_{R,i}(f)$ is the contribution of reference noise to the total noise floor.

The total noise spectrum ($S_i(f)$) for a sampled phase $\phi_i$ is given by:

$$S_i(f) = S_{R,i}(f) + S_{J,i}(f) + S_T(f) + S_F(f) \qquad \text{EQ. 6}$$

where, $S_T(f)$ and $S_F(f)$ are the components from thermal noise and channel flicker noise.

As discussed before, the thermal noise and channel flicker noise remain fairly constant for different input signal conditions.

EQ. 3, EQ. 5 and EQ. 6 can be re-written as:

$$S_i(f) = \rho(f) * n_i^2/N^2 + \zeta(f) * \psi_i^2 + K \qquad \text{EQ. 7}$$

Where $K = S_T(f) + S_F(f)$ has been assumed to be a constant over "i" (i.e., different sampled phase);

Eq. 7 is a bi-variate equation and can be solved employing least means square. Eq. 7 can be rewritten as:

$$z_i = \alpha x_i + \beta y_i + K \qquad \text{EQ. 8}$$

where $z_i = S_{N,i}(f)$, $x_i = n_i^2/N^2$, $y_i = \psi_i^2$, $\alpha = \rho(f)$, and $\beta = \zeta(f)$.

It is to be appreciated that $z_i$, $\alpha$ and $\beta$ are vectors and each of their values correspond to different frequency bins spanning from dc to the Nyquist Frequency.

For different settings of $\phi_i$, (preferably more than twice the number of stage capacitors), $\alpha$, $\beta$, and K can be estimated using the three least square equations:

$$\langle z \rangle = \alpha \langle x \rangle + \beta \langle y \rangle + K \qquad \text{EQ. 9}$$

$$\langle zx \rangle = \alpha \langle x^2 \rangle + \beta \langle xy \rangle + K \langle x \rangle \qquad \text{EQ. 10}$$

$$\langle zy \rangle = \alpha \langle xy \rangle + \beta \langle y^2 \rangle + K \langle y \rangle \qquad \text{EQ. 11}$$

Solving EQ. 9, EQ. 10 and EQ. 11 provides estimates of $\alpha(=\rho(f))$, $\beta(=\zeta(f)$ and $K(=S_T(f)+S_F(f))$. The power spectral domain of reference noise ($\rho(f)$) and aperture jitter ($\zeta(f)$) can be used to calculate the integrated noise caused be reference and aperture jitter separately. The jitter noise power and the reference noise power can be obtained over a given bandwidth by integrating their respective power spectral domains over that bandwidth.

Figure 2:
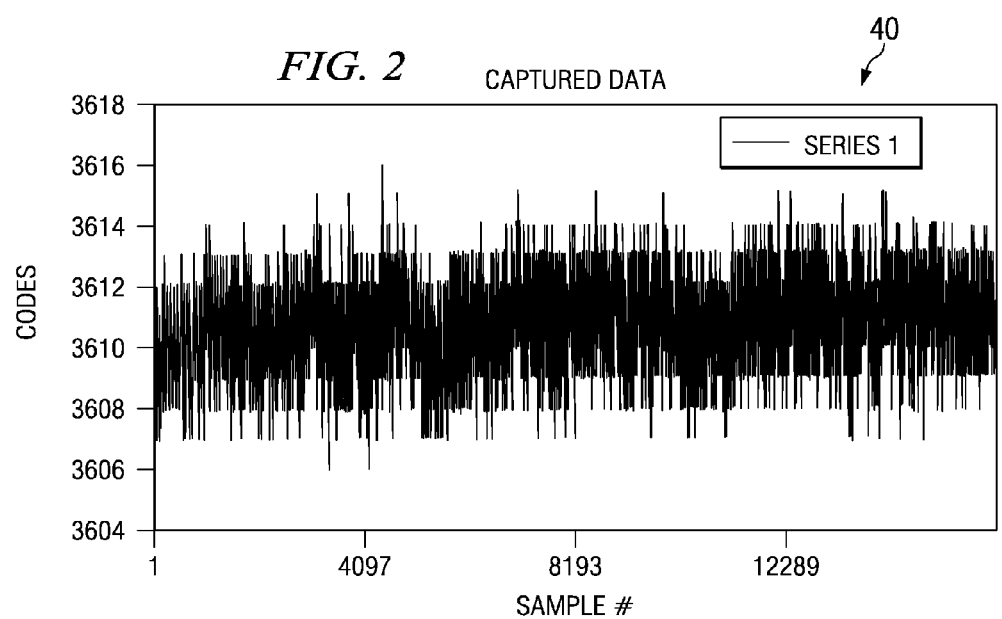
FIG. 2 illustrates an output of an exemplary pipelined ADC of sampled digital codes at a given phase of an input signal.
Figure 3:
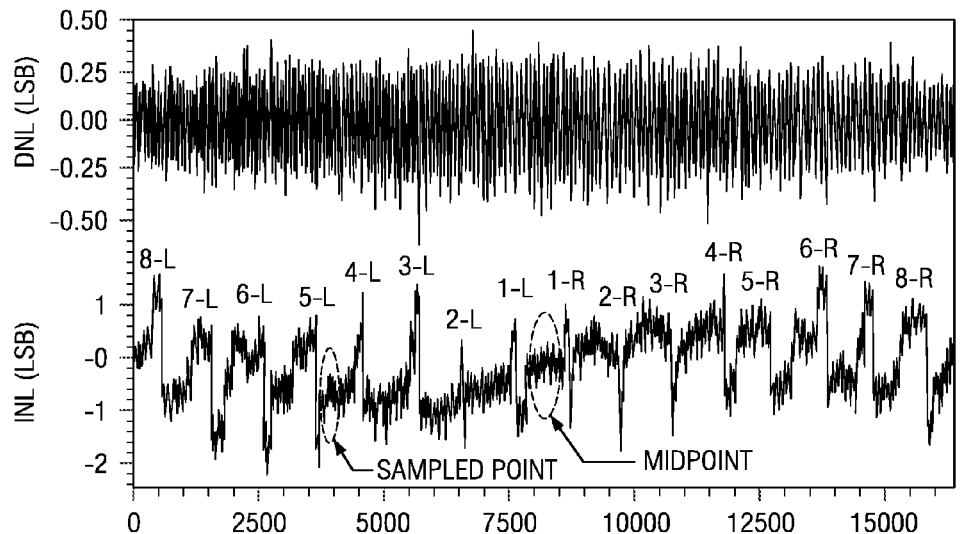
FIG. 3 illustrates an integral non-linearity (INL) curve of the pipeline ADC of FIG. 2.
Figure 4:
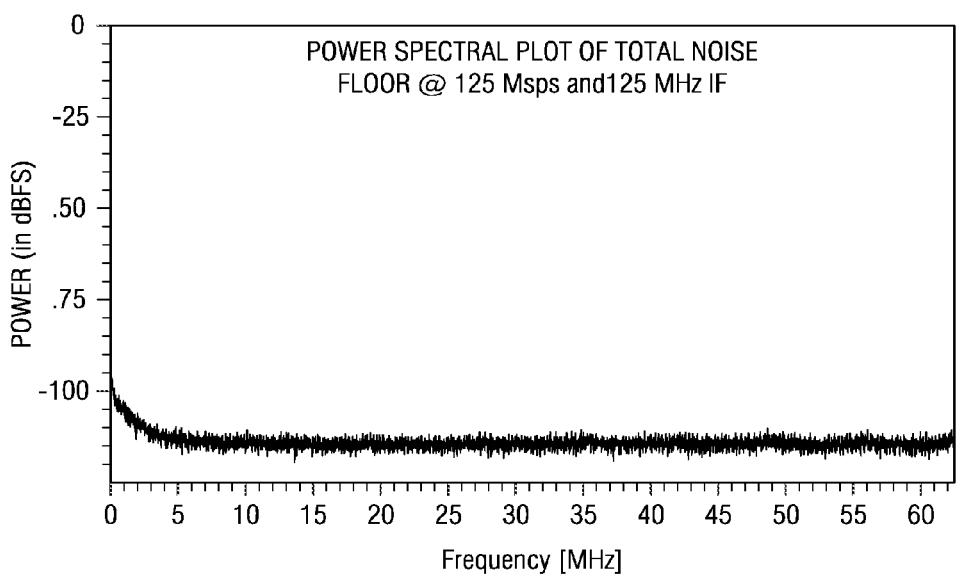
FIG. 4 illustrates a power spectral density plot of the total noise floor of the sampled input signal of FIG. 2.

An example of obtaining an aperture jitter noise factor value, a reference noise factor value and a total noise factor value for a given phase sample is provided with reference to FIGS. 2-4. The present example will be based on an ADC operating at 125 mega samples per second (Msps) and has a resolution of 14 bit (e.g., code ranging from 0-16384). Therefore, a zero code is the most negative code, 16384 is the most positive code and 8192 is the ideal center code. The code range from 8192 to 16384 is the positive half and the code range from 8192 down to zero is ideally the symmetric negative half. In practice the ADC may have some offset and the measured centre code (mean of the plurality of captured codes without any input) may be different from 8192. The input signal provided to the signal input and the clock input has a frequency of about 125 MHz and a maximum amplitude that is −3 dbFS below the maximum range of the ADC.

FIG. 2 illustrates an output spectra 40 of 16,384 sampled digital codes at the given phase sampled phase of the input signal. The measured mean of the sampled codes has been determined to be 3610.76. The measured mean of sampled codes without any input (zero input) has been determined as 8193.50. This is treated to be the actual centre of the ADC. Therefore, the distance from the center code can be determined as 8193.50 (½ full scale plus offset) minus 3610.76, which is equal to 4582.74. The amplitude in the digital scale $A_{DS}$ of the input signal can be determined as −3 db of 8192, which is 0.707*8192 which is equal to 5799.49. Based on EQ. 1 and the relationship that the slope is the derivative of the input signal at the sampled point, the cosine being the derivative of the sine input signal and the cosine being equal to 1−sine², the normalized slope at the sampling phase can be determined as follows:

$$\psi_i^2 = \{1 - (\mu/A_{DS})^2\} * (A_{AS} * 2 * \pi * f_0)^2 \qquad \text{EQ. 12}$$

where $f_0$ is the clock frequency, which is 125 MHz in the example and $A_{AS}$ is the amplitude at absolute scale, which is 0.707. The jitter noise factor value at the given phase point is $\psi_i^2$ which is approximately $1.16116 \times 10^{17}$, which is the y-value of the least means square analysis, where the total noise from jitter is based on EQ. 3 above.

The reference noise value is based on EQ. 5 above where $n_i$ represents the number of capacitors in Stage-1 connected to references corresponding to average code $\mu_i$ and N is the total number of Stage-1 capacitors that may get connected to the reference. In the illustrated example, the number of stage-1 capacitors is eight. As illustrated in the INL curve 60 of FIG. 3, the number of capacitors that get connected for code 3610 is four. Therefore, the reference noise factor value is $n_i^2/N^2$ which is $4^2/8^2$ or 0.25, which is the x-value of the least means square analysis, where the reference noise is based on EQ. 5 above.

FIG. 4 illustrates a power spectral density plot 80 of the total noise floor of the sampled input signal. The power spectral plot 80 is derived from performing an FFT based averaged power spectral analysis on the plurality of output codes of FIG. 2. These happen to be the z-value of the least means square analysis. Integrating the noise power spectral density from zero to the Nyquist frequency gives the total noise power of the ADC output at the sampled phase point. The total noise power in the present example is 73.299 dbFS in the log domain which is equal to approximately 4.67842 $e^{-8}$ in the linear domain.

For each reading taken from different sampled phase on the input signal, for example, employing different cable assemblies having varying path lengths relative to one another, a different slope value $\psi_i$ value can be obtained to determine a different jitter noise factor (y-value), a different position of the INL curve indicating a different number of stage-1 caps being connected to determine a different reference noise factor (x-value), and a power spectral plot of the total noise can be employed to determine a different total noise spectrum (z-value). A least mean square estimation can be performed on the system of equations (EQ. 9, 10 and 11) formed by different x, y and z values to determine $\alpha$ (equal to the power spectrum density of jitter $\zeta(f)$, $\beta$ (equal to the power spectrum density of reference noise $\rho(f)$) and the total thermal and flicker components $K(=S_T(f)+S_F(f))$. The jitter noise power component and reference noise power component can be obtained over a given bandwidth by integrating the respective power spectrum densities over the given bandwidth.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 5 illustrates a methodology for determining noise components of a pipelined ADC in accordance with an aspect of the present invention. At 100, a same input signal is provided to both a clock input and a signal input of the ADC. The same input signal can be a sine wave having a fixed frequency and a fixed amplitude. At 110, the ADC samples are captured and a mean digital output code for the plurality of samples at the sampling phase is considered as the representative code for that sampling phase. At 120, a jitter noise factor is determined based on the slope of the mean digital code based on EQ. 12 above. The methodology then proceeds to 130.

At 130, a reference noise factor value is determined. The reference noise factor can be determined by analyzing the INL curve and matching the mean digital code to the number of stage-1 capacitors coupled to reference value. The squared ratio of the number of stage-1 capacitors connected to the references to the total number of stage-1 capacitors gives the reference noise factor at the sampled point. At 140, a total noise power spectral density is determined. The total noise power spectral density can be determined by performing an FFT on the output spectra to produce a power spectral plot of the total noise floor. The power spectral plot can be integrated from zero to the Nyquist frequency to obtain the total noise power spectral density of the ADC output at the sampled phase point. The methodology then proceeds to 150.

At 150, a determination is made on whether the last sampling phase has been sampled. If the last sampling phase has not been sampled (NO), the methodology proceeds to 160 to phase shift one of the signal input and clock input relative to other of the signal input and clock input. For example, the phase shifting can be performed by employing different cable assemblies having input branches and clock branches of varying lengths relative to one another. The methodology then returns to 110 to sample an output at a new phase associated with the phase shift. If the last sampling phase has been sampled (YES) at 150, the methodology proceeds to 170.

At 170, a least means square algorithm is employed on the resultant system of equations to determine the power spectral density of the jitter noise, the power spectral density of the reference noise, and the power spectral density of the sum of the flicker noise and thermal noise. At 180, the power spectral density of the jitter noise is integrated over a given bandwidth to determine the jitter noise component over that bandwidth, the power spectral density of the reference noise is integrated over the given bandwidth to determine the reference noise component over that bandwidth, and the power spectral density of the sum of the flicker noise and thermal noise is integrated over the given bandwidth to determine the sum of the flicker noise and thermal noise components over that bandwidth.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A method for determining noise components of an analog-to-digital converter (ADC), the method comprising:
   providing an input signal to a signal input and a clock input of the ADC;
   outputting a plurality of samples at a sampled phase on the input signal for a plurality of sampled phases;
   determining a jitter noise factor value, a reference noise factor value, and a total noise spectrum based on the plurality of samples for each of the plurality of sampled phases; and
   performing a least means square algorithm on the plurality of jitter noise factor values, reference noise factor values, and total noise spectra to estimate at least one of a jitter noise component and a reference noise component;
   wherein the performing a least means square algorithm on the plurality of jitter noise factor values, reference noise factor values, and total noise spectra determines a jitter noise power spectrum density, a reference noise power spectrum density and a constant substantially equal to a power spectrum density of a sum of a channel flicker noise and a thermal noise.

2. The method of claim 1, wherein the input signal is a sine wave having a fixed frequency and a fixed maximum amplitude.

3. The method of claim 1, wherein the determining the jitter noise factor comprises determining the slope of the sampled phase based on the mean of the plurality of samples.

4. The method of claim 3, wherein determining the slope comprises evaluating the equation:

$$\psi_i^2 = \{1-(\mu_i/A_{SD})^2\}*(A_{AS}*2*\pi*f_0)^2,$$

where $\psi_i$ is the slope of the input signal at the sampling phase, $\mu_i$ is the mean of the plurality of samples, $A_{DS}$ is the amplitude of the input signal in digital scale, $A_{AS}$ is the amplitude of the input signal in absolute scale and $f_0$ is the frequency of the input signal.

5. The method of claim 1, wherein the determining the reference noise factor comprises determining a number of stage-1 capacitors switched to reference nodes over a total number of stage-1 capacitors of the ADC based on the mean of the plurality of samples.

6. The method of claim 5, wherein the determining a number of stage-1 capacitors switched to reference nodes is based on comparing the mean of the plurality of samples to an integral non-linearity (INL) curve of the ADC.

7. The method of claim 1, further comprising performing a fast fourier transform based power spectrum analysis on the plurality of samples and integrating the noise from zero to Nyquist frequency to determine the total noise spectrum at the sampled phase.

8. The method of claim 1, further comprising integrating the jitter noise density over a first bandwidth to determine a jitter noise component over the first bandwidth.

9. The method of claim 1, further comprising integrating the reference noise density over a second bandwidth to determine a reference noise component over the second bandwidth.

10. The method of claim 1, further comprising phase shifting one of the signal input and the clock input to the ADC relative to the other of the signal input and the clock input to phase shift the sampled phase over the plurality of sampled phases.

11. The method of claim 10, wherein the phase shifting comprises adjusting one of a first path length to the signal input and second path length to the clock input from the input signal over a plurality of varying path lengths to phase shift the input signal relative to the clock signal to provide the plurality of sampled phases.

12. A method for determining noise components of a pipeline analog-to-digital converter (ADC), the method comprising:
   providing a sine wave input signal having a fixed frequency and a fixed maximum amplitude to a signal input and a clock input of the ADC;
   capturing a plurality of digital samples output by the ADC at a sampled phase on the input signal;
   determining a jitter noise factor value, a reference noise factor value, and a total noise spectrum based on the plurality of digital samples at the sampled phase;

adjusting one of a first path length to the signal input and second path length to the clock input from the sine wave input signal over a plurality of varying path lengths to phase shift the input signal relative to the clock signal to provide a plurality of sampled phases;

repeating the providing, capturing, determining and phase shifting for each of the plurality of sampled phases to determine a jitter noise factor value, a reference noise factor value, and a total noise spectrum for each of the plurality of sampled phases; and performing a least means square algorithm on the plurality of jitter noise factor values, reference noise factor values, and total noise spectra to determine a jitter noise power spectrum density, a reference noise power spectrum density and a constant substantially equal to a power spectrum density of a sum of a channel flicker density and a thermal noise density.

13. The method of claim 12, wherein the determining the jitter noise factor value comprises determining the slope of the sampled phase based on the mean of the plurality of digital samples and evaluating the equation:

$$\psi_i^2 = \{1 - (\mu/A_{DS})^2\} * (A_{AS} * 2 * \pi * f_0)^2,$$

where $\psi_i$ is the slope of the input signal at the sampling phase, $\mu$ is the mean of the plurality of digital samples, $A_{DS}$ is the amplitude of the input signal in the digital scale, $A_{AS}$ is the amplitude of the input signal in the absolute scale and $f_0$ is the frequency of the input signal.

14. The method of claim 12, wherein the determining the reference noise factor value comprises determining a number of stage-1 capacitors switched to references, based on comparing the mean of the plurality of samples to an integral non-linearity (INL) curve of the ADC, over a total number of stage-1 capacitors of the ADC based on the mean of the plurality of samples.

15. The method of claim 12, further comprising performing a fast fourier transform based power spectrum analysis on the plurality of digital samples to determine the total noise spectrum at the sampled phase.

16. The method of claim 12, further comprising integrating the jitter noise density over a first bandwidth to determine a jitter noise component over the first bandwidth, and integrating the reference noise density over a second bandwidth to determine a reference noise component over the second_bandwidth.

17. A system for determining noise components of a pipeline analog-to-digital converter (ADC), the system comprising:

a radio frequency (RF) source operative to provide a sine wave input signal of a fixed frequency and amplitude;

a plurality of cable assemblies, each cable assembly having an input for coupling to the RF source, a first branch coupleable to a signal input of the pipeline ADC and a second branch coupleable to a clock input of the ADC for providing the sine wave input signal to both the signal input and the clock input of the ADC, wherein the length of the first branch minus the length of the second branch differs among the cable assemblies for phase shifting the input signal relative to the clock signal, such that a different sampling phase is sampled by the ADC for each of the plurality of cable assemblies when coupled between the RF source and the ADC; and an analysis system operative to capture a plurality of output samples for each sampling phase and be employed to determine a jitter noise factor value, a reference noise factor value, and a total noise spectrum for each of the different sampling phases;

wherein the analysis system further comprises a least means square algorithm that can be performed on the jitter noise factor values, reference noise factor values, and total noise spectra for each different sampling phase to determine a jitter noise power spectrum density, a reference noise power spectrum density and a constant substantially equal to a power spectral density of a sum of a channel flicker noise and a thermal noise.

18. The system of claim 17, wherein the analysis system is operative to generate a power spectral plot of the total noise floor based on the plurality of output samples for determining the total noise spectrum.

* * * * *